(12) United States Patent
Lanzillo et al.

(10) Patent No.: US 11,908,738 B2
(45) Date of Patent: Feb. 20, 2024

(54) INTERCONNECT INCLUDING INTEGRALLY FORMED CAPACITOR

(71) Applicant: International Business Machines Corporation, Armonk, NY (US)

(72) Inventors: Nicholas Anthony Lanzillo, Wynantskill, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 17/451,254

(22) Filed: Oct. 18, 2021

(65) Prior Publication Data
US 2023/0123372 A1 Apr. 20, 2023

(51) Int. Cl.
*H01L 21/768* (2006.01)
*H01L 23/522* (2006.01)

(52) U.S. Cl.
CPC .... *H01L 21/76879* (2013.01); *H01L 23/5223* (2013.01); *H01L 23/5226* (2013.01)

(58) Field of Classification Search
CPC ........... H01L 21/76879; H01L 23/5223; H01L 23/5226
USPC ....................................................... 257/774
See application file for complete search history.

(56) References Cited

U.S. PATENT DOCUMENTS

| | | | |
|---|---|---|---|
| 7,728,432 B2 | 6/2010 | Takewaki et al. | |
| 7,763,519 B2 | 7/2010 | Barth et al. | |
| 8,980,708 B2 | 3/2015 | Zhu et al. | |
| 9,502,350 B1 | 11/2016 | Bonilla et al. | |
| 9,805,976 B2 | 10/2017 | Shaviv et al. | |
| 10,580,691 B2 | 3/2020 | Chae et al. | |
| 10,923,392 B2 | 2/2021 | Chae et al. | |
| 2002/0192919 A1 | 12/2002 | Bothra | |
| 2003/0025143 A1* | 2/2003 | Lin | H01L 28/40 257/E21.582 |
| 2006/0118907 A1* | 6/2006 | Park | H01L 23/5223 257/532 |
| 2015/0162398 A1* | 6/2015 | Huang | H01L 28/87 257/532 |
| 2016/0049461 A1 | 2/2016 | Magnee et al. | |

(Continued)

FOREIGN PATENT DOCUMENTS

WO 2021015833 A1 1/2021

OTHER PUBLICATIONS

Grok Circuits, "Integrated Capacitors," https://grokcircuits.com/2017/08/15/integrated-capacitors/, printed Aug. 20, 2021, 3 pgs.

(Continued)

*Primary Examiner* — Tu-Tu V Ho
(74) *Attorney, Agent, or Firm* — Kelli D. Morin

(57) ABSTRACT

A method of making a semiconductor component includes depositing a first metal material onto a structure having a first cavity and a second cavity such that the first metal material fills the first cavity and forms a first lining on exposed surfaces of the second cavity. The method further includes depositing a dielectric material onto the structure such that the dielectric material forms a second lining on exposed surfaces of the first lining. The method further includes depositing a second metal material onto the structure such that the second metal material fills remaining volume in the second cavity.

20 Claims, 5 Drawing Sheets

(56) References Cited

U.S. PATENT DOCUMENTS

2017/0256449 A1    9/2017  Zhang et al.
2019/0295942 A1    9/2019  Badaroglu et al.

OTHER PUBLICATIONS

Wei, F., "Effects of Mechanical Properties on the Reliability of Cu/low-k Metallization Systems," https://dspace.mit.edu/bitstream/handle/1721.1/42026/228302844-MIT.pdf?sequence=2&isAllowed=y, Sep. 2007, 217 pgs.

* cited by examiner

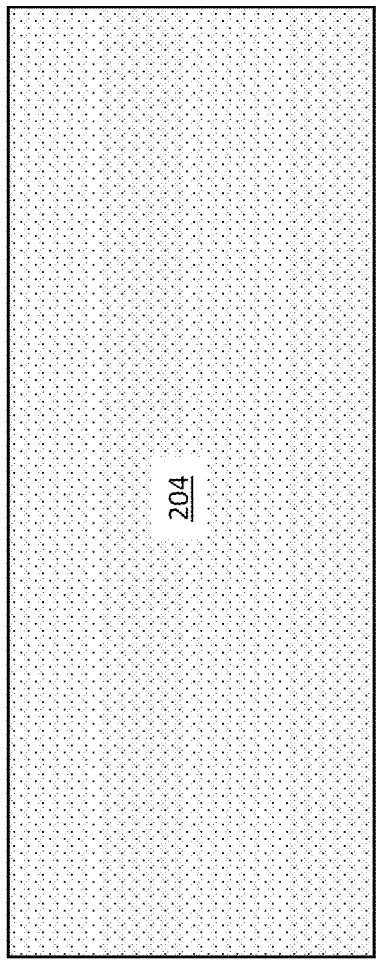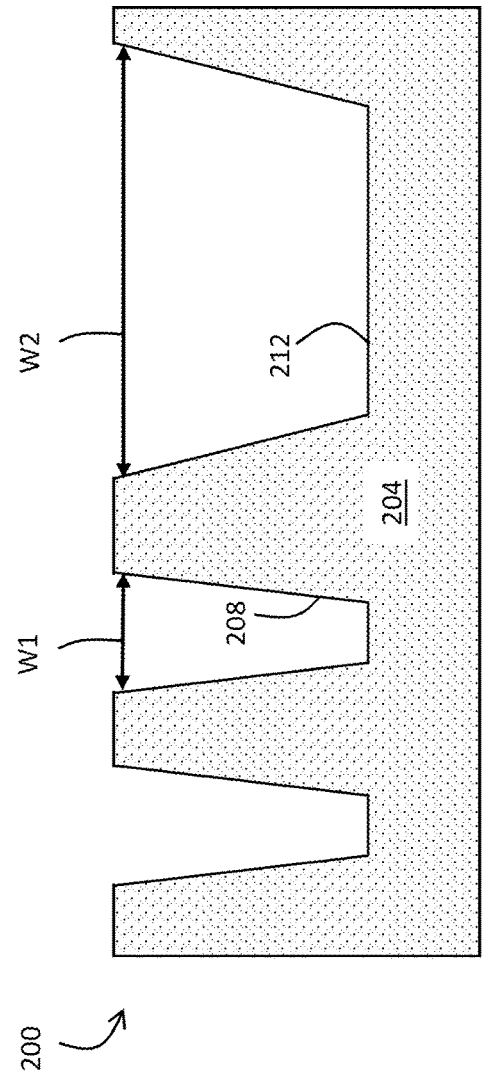

US 11,908,738 B2

INTERCONNECT INCLUDING INTEGRALLY FORMED CAPACITOR

BACKGROUND

The present disclosure relates to the electrical, electronic, and computer fields. In particular, the present disclosure relates to the interconnects of semiconductor devices and methods of making the interconnects of semiconductor devices.

In integrated circuits, interconnects are structures that connect two or more circuit elements together electrically. In addition to providing the electrical connection to the front end devices (such as transistors), interconnects also go all the way to the power supply at the top of the chip. Thus, interconnects, and their surrounding support components, are considered back-end-of-line (BEOL) components. Lines provide electrical connection within a single layer, and vias provide electrical connection between layers in a physical electronic circuit.

SUMMARY

Embodiments of the present disclosure include a method of making a semiconductor component. The method includes depositing a first metal material onto a structure having a first cavity and a second cavity such that the first metal material fills the first cavity and forms a first lining on exposed surfaces of the second cavity. The method further includes depositing a dielectric material onto the structure such that the dielectric material forms a second lining on exposed surfaces of the first lining. The method further includes depositing a second metal material onto the structure such that the second metal material fills remaining volume in the second cavity.

Additional embodiments of the present disclosure include a semiconductor component. The semiconductor component includes a dielectric material including a first cavity and a second cavity. The semiconductor component further includes a first metal material in direct contact with the dielectric material such that the first metal material fills the first cavity and such that the first metal material forms a first lining in the second cavity. The semiconductor component further includes a further dielectric material in direct contact with the first metal material such that the further dielectric material forms a second lining in the second cavity. The semiconductor component further includes a second metal material in direct contact with the further dielectric material such that the second metal material fills the second cavity.

Additional embodiments of the present disclosure include a semiconductor component. The semiconductor component includes a dielectric material having a first cavity and a second cavity. The first cavity is filled with a first metal material. The second cavity is lined with the first metal material, lined with a further dielectric material, and filled with a second metal material such that the first metal material, further dielectric material, and second metal material form a capacitor in the second cavity.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2A illustrates an example of a component following the performance of a portion of the example method of FIG. 1, in accordance with embodiments of the present disclosure.

FIG. 2B illustrates an example of a component following the performance of a portion of the example method of FIG. 1, in accordance with embodiments of the present disclosure.

DETAILED DESCRIPTION

Figure 1:
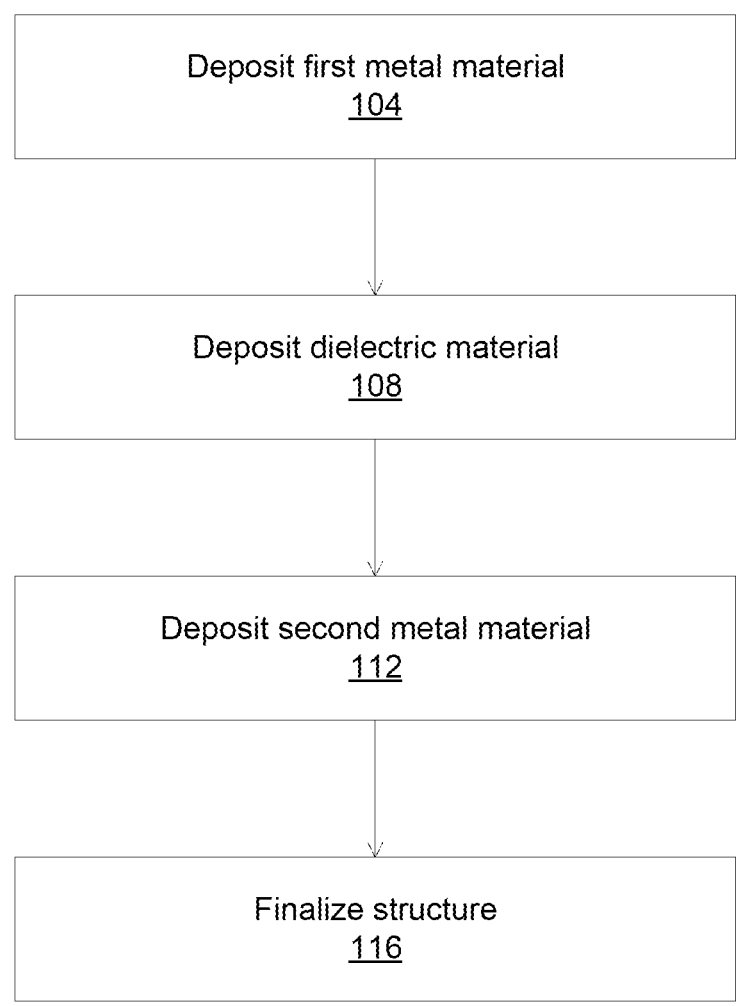
FIG. 1 illustrates a flowchart of an example method for forming a semiconductor component, in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects extend to the top of the chip, where the power supply is located. Thus, interconnects, and their surrounding support components, are considered back-end-of-line (BEOL) components. Lines provide electrical connection within a single layer, and vias provide electrical connection between layers in a physical electronic circuit.

More specifically, the electrical connections provided by lines can be used to transmit power and to transmit signals. Typically, narrower lines, having relatively small widths, are used to transmit signals, and wider lines, having relatively large widths, are used to transmit power. In practice, wider lines can be used to transmit signals, and narrow lines can be used to transmit power. However, for the purposes of this discussion, wide lines are discussed in the context of their use as power lines and narrow lines are discussed in the context of their use as signal lines.

In current interconnect technologies, interconnects are typically made of copper due to its low resistivity. However, the resistivity of copper increases problematically as metal lines get thinner. Therefore, as interconnect technology is scaled to smaller and smaller sizes, copper begins to suffer from increasingly higher resistivity in increasingly narrow lines, which limits chip performance. Accordingly, alternate materials, meaning materials other than copper, are increasingly being considered to form the narrower signal lines. However, using such alternate materials is not desirable for the wider power lines because copper still provides superior performance due to its lower resistivity in those applications.

Signal lines carry current from one transistor to another. Due to their relative narrowness, signal lines have high resistances (for example, one or more kiloohms) and carry currents at relatively low current densities. In contrast, power lines carry power from a global power grid to individual transistor cells. Due to their relative wideness, power lines have low resistances and carry currents at extremely high current densities. Unfortunately, such wide pathways that experience extremely high current densities are prone to current spikes, which make the power lines susceptible to reliability failure, for example failure due to electromigration.

One way to mitigate such potential failures is to introduce a metal-insulator-metal (MIM) capacitor into the interconnect circuitry. For example, a MIM capacitor can be embedded between interconnects, such as between a line and a via. MIM capacitors increase capacitance density, thereby stabilizing current density in wide lines, which reduces the likelihood of reliability failure due to current spikes. Additionally, the increased decoupling capacitance generated by MIM capacitors reduces power supply noise, which is critical for high performance computing (HPC) product chips.

Embodiments of the present disclosure may overcome these and other drawbacks of existing solutions by including both narrower lines made of an alternate material and wider lines made of copper in an interconnect component. As discussed in further detail below, such embodiments include utilizing a composite metallization scheme to form a metal-dielectric-metal (MDM) capacitor, which produces the same effect as a MIM capacitor. Additionally, embodiments of the present disclosure may overcome drawbacks of existing solutions by including such a MDM capacitor that is functionally interconnected with a wide line in interconnect circuitry, especially for HPC applications. As discussed in further detail below, embodiments of the present disclosure include integrating an MDM capacitor into a wide power line. In particular, embodiments of the present disclosure enable utilizing a composite metallization scheme to form a wide power line such that the wide power line includes an integrally formed MDM capacitor. Such embodiments include an MDM capacitor surrounding a wide power line, thereby increasing capacitance density and stabilizing current without requiring the inclusion of an additional, separate MIM capacitor.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD), among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously. Subtractive and damascene schemes can both be used in the formation of complex interconnect structures.

FIG. 1 depicts a flowchart of an example method 100 for forming a semiconductor component, according to embodiments of the present disclosure. The method 100 begins with operation 104, wherein a first metal material is deposited onto a structure. In accordance with at least one embodiment of the present disclosure, operation 104 further includes a number of sub-operations.

More specifically, the performance of operation 104 includes depositing the first metal material onto a structure that has a first cavity and a second cavity. In accordance with at least one embodiment, the structure is made of a dielectric material, and the first cavity and the second cavity are formed in the dielectric material. In particular, the first metal material is deposited so as to be in direct contact with the dielectric material.

The dielectric material may be, for example, an ultra-low-k dielectric material. The first metal material can be, for example, an alternate material. As used herein, the term "alternate material" refers to a conductive metal material that is not copper and is suitable for use in interconnect signal lines. The first metal material may be, for example, cobalt, ruthenium, tungsten, molybdenum, iridium, or rhodium. In accordance with at least one embodiment, the first metal material can include more than one alternate material.

Additionally, in accordance with at least one embodiment, the first metal material can include multiple layers of different materials. For example, the first metal material can include a thin layer of a lining material to promote adhesion of the alternate material to the dielectric material. In such embodiments, the lining material can be, for example, tantalum or tantalum nitride. In such embodiments, the term "first metal material" refers collectively to the alternate material as well as to the lining material.

In some embodiments, the performance of operation 104 of the method 100 may include forming the dielectric material. The dielectric material can be formed, for example, by deposition.

FIG. 2A depicts an example structure 200 following the formation of the dielectric material in such embodiments. Accordingly, as shown in FIG. 2A, the structure 200 includes a dielectric material 204.

In some embodiments, the performance of operation 104 of the method 100 may include forming the first and second cavities in the dielectric material. The first and second cavities may be formed, for example, by performing a lithography process and an etch process on the dielectric material.

In accordance with at least one embodiment of the present disclosure, the formation of the first and second cavities includes the formation of many cavities, including the first and second cavities. For example, the formation of a metal layer including interconnect components during conventional fabrication processes may include the formation of millions of cavities simultaneously. Such cavities are filled subsequently with conductive materials to form lines or vias. Metal layers that are fabricated to include both signal lines and power lines will be formed having both narrow cavities, which can be used to form the signal lines, and wide cavities, which can be used to form the power lines. Notably, power lines can be either ground or power lines.

FIG. 2B depicts the example structure 200 following the formation of the first and second cavities in such embodiments. Accordingly, as shown in FIG. 2B, the structure 200 includes a first cavity 208 and a second cavity 212 formed in the dielectric material 204. The first cavity 208 is a narrow cavity, which can be used to form a signal line, and the second cavity 212 is a wide cavity, which can be used to form a power line. Accordingly, the first cavity 208 has a first width W1 which is narrower than a second width W2 of the second cavity 212.

Returning to FIG. 1, in the performance of operation 104, the first metal material is deposited onto the structure such that the first metal material fills the first cavity and such that the first metal material forms a first lining on exposed surfaces of the second cavity. As explained in further detail below, when the interconnect structure is complete, the first metal material in the first cavity will form a signal line, and the first metal material in the second cavity will form one of the metal layers of an MDM capacitor in a power line.

In accordance with at least one embodiment, the first metal material can be deposited onto the structure by a CVD process. For embodiments in which the first metal material includes a liner material, depositing the first metal material onto the structure can include depositing the liner material followed by depositing the alternate material. In such embodiments, the alternate material can be deposited by a CVD process.

Figure 2C:
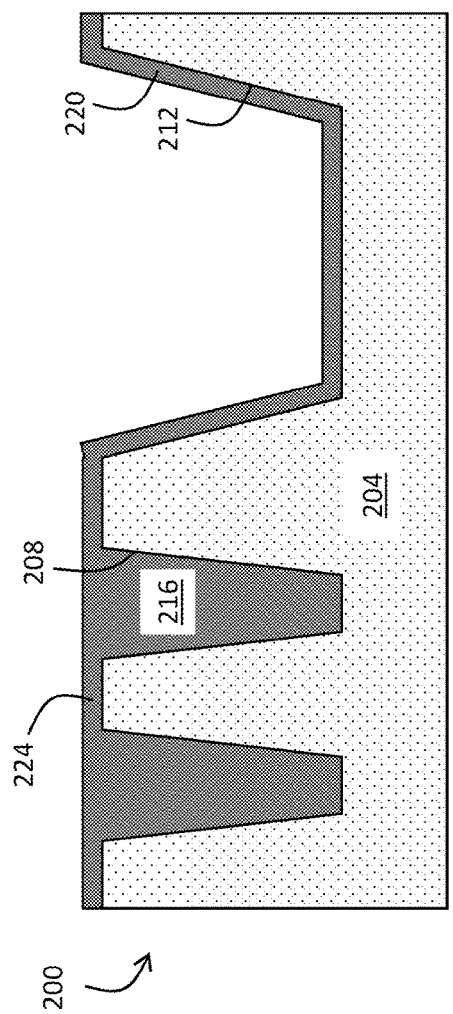
FIG. 2C illustrates an example of a component following the performance of a portion of the example method of FIG. 1, in accordance with embodiments of the present disclosure.

FIG. 2C depicts the example structure 200 following the performance of operation 104 of the method 100. Accordingly, FIG. 2C shows that the first cavity 208 has been filled with the first metal material 216 and that the second cavity 212 has been lined with the first metal material 216 such that the first metal material 216 forms a first lining 220 on exposed surfaces of the second cavity 212. In the example embodiment, to help ensure that the first cavity 208 is completely filled with the first metal material 216, the first metal material 216 is applied so as to fill the first cavity 208 and also to form a layer 224 of the first metal material 216 on top of the filled first cavity 208 and the surrounding dielectric material 204.

Returning to FIG. 1, following the performance of operation 104, the method 100 proceeds with the performance of operation 108 wherein a further dielectric material is deposited onto the structure. More specifically, the further dielectric material is deposited onto the structure such that the further dielectric material forms a second lining on exposed surfaces of the first lining. Additionally, the further dielectric material forms a second layer on top of the layer of the first metal material on top of the first filled cavity. Accordingly, the further dielectric material is in direct contact with the first metal material. The further dielectric material can be, for example, a high-k dielectric material. As explained in further detail below, when the interconnect structure is complete, the further dielectric material in the second cavity will form the dielectric layer of an MDM capacitor in a power line.

Figure 2D:
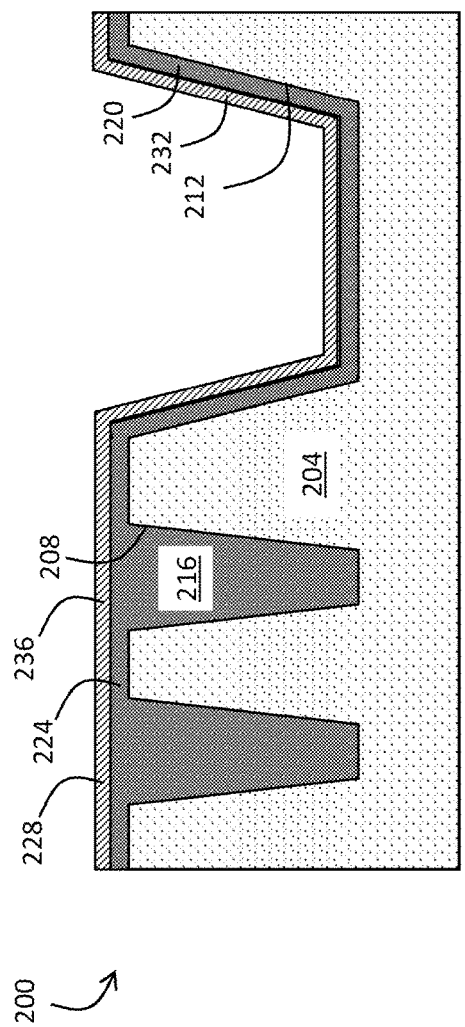
FIG. 2D illustrates an example of a component following the performance of a portion of the example method of FIG. 1, in accordance with embodiments of the present disclosure.

FIG. 2D depicts the example structure 200 following the performance of operation 108 of the method 100. Accordingly, FIG. 2D shows that a further dielectric material 228 has been deposited on the structure 200 such that the further dielectric material 228 forms a second lining 232 on exposed surfaces of the first lining 220 within the second cavity 212. Additionally, the further dielectric material 228 also forms a second layer 236 on top of the layer 224 of the first metal material 216 that is arranged on top of the first filled cavity 208 and the surrounding dielectric material 204.

Returning to FIG. 1, following the performance of operation 108, the method 100 proceeds with the performance of operation 112 wherein a second metal material is deposited onto the structure. More specifically, the second metal material is deposited onto the structure such that the second metal material fills remaining volume in the second cavity. Accordingly, the second metal material is in direct contact with the further dielectric material. The second metal material can be, for example, copper. As explained in further detail below, when the interconnect structure is complete, the second metal material in the second cavity will form a power line. Additionally, the second metal material in the second cavity will also form the second metal layer of an MDM capacitor in the power line.

In accordance with at least one embodiment of the present disclosure, the second metal material can be deposited, for example, by seed deposition. More specifically, the second metal material can be deposited by PVD seed deposition. In such embodiments, depositing the second metal material can also include electroplating.

Figure 2E:
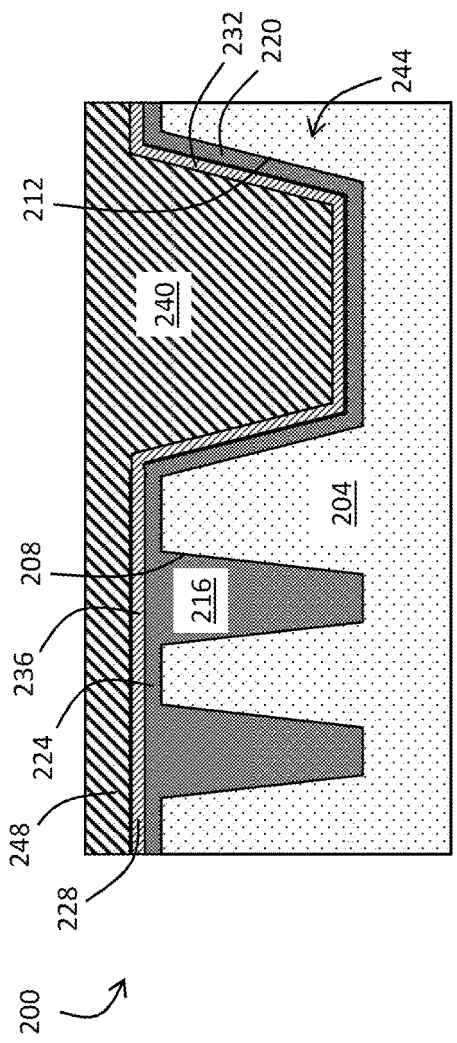
FIG. 2E illustrates an example of a component following the performance of a portion of the example method of FIG. 1, in accordance with embodiments of the present disclosure.

FIG. 2E depicts the example structure 200 following the performance of operation 112 of the method 100. Accordingly, FIG. 2E shows that a second metal material 240 has been deposited on the structure 200 such that the second metal material 240 fills all remaining volume within the second cavity 212. More specifically, the second metal material 240 fills the remaining volume of the second cavity 212 that was not already occupied by the first lining 220 and the second lining 232. Accordingly, the second metal material 240 forms a power line in the interconnect structure. Additionally, together with the first metal material 216 that forms the first lining 220 and the further dielectric material 228 that forms the second lining 232, the second metal material 240 also completes the metal-dielectric-metal capacitor 244 in the second cavity 212. The second metal material 240 also forms a third layer 248 on top of the second layer 236 of the further dielectric material 228.

Returning to FIG. 1, following the performance of operation 112, the method 100 proceeds with the performance of operation 116 wherein the structure is finalized. In accordance with at least one embodiment of the present disclosure, finalizing the structure includes performing a metal and dielectric CMP procedure on the structure. In such embodiments, portions of the first metal material, the further dielectric material, and the second metal material that are outside of the first and second cavities are removed. Additionally, the top surface of the structure is planarized.

Figure 2F:
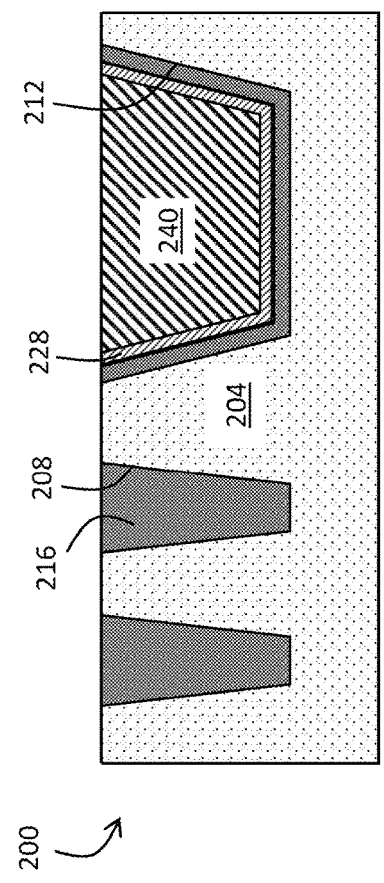
FIG. 2F illustrates an example of a component following the performance of a portion of the example method of FIG. 1, in accordance with embodiments of the present disclosure.

FIG. 2F depicts the example structure 200 following the performance of operation 116 of the method 100. Accordingly, FIG. 2F shows that the portions of the first metal material 216, the further dielectric material 228, and the second metal material 240 that were outside of the first cavity 208 and the second cavity 212 have been removed. In other words, the layer 224 (shown in FIG. 2E) of the first metal material 216, the second layer 236 (shown in FIG. 2E) of the further dielectric material 228, and the third layer 248 (shown in FIG. 2E) of the second metal material 240 have been removed. Additionally, the top surface of the structure 200 has been planarized. Accordingly, the first metal material 216 in the first cavity 208 forms a signal line and the second metal material 240 in the second cavity 212 forms a power line in the structure 200, and the structure 200 is ready to be combined with other structures to transmit signals and power in a semiconductor device.

Once the structure is finalized, the first metal material is isolated in the first cavity by the dielectric material. The first metal material thus provides a narrow signal line made of an alternate material in the interconnect structure. The first metal material also provides the first metal layer of an MDM capacitor in the second cavity. Additionally, the further dielectric material, in direct contact with the first metal layer in the second cavity, provides the dielectric layer of the MDM capacitor in the second cavity. The second metal material provides the second metal layer of the MDM capacitor in the second cavity and also provides a wide power line made of copper in the interconnect structure. The first metal layer, the further dielectric layer, and the second metal layer make up the MDM capacitor in the second cavity, and the first metal layer and the further dielectric layer surround the second metal layer.

In this way, performance of the method 100 enables formation of a structure that includes integrating an MDM capacitor into a wide power line. In other words, the MDM capacitor is integrally formed with the power line and surrounds the power line. Accordingly, the structure facilitates increased capacitance density and current stabilization without requiring a separate capacitor device.

The example structure 200 shown in FIG. 2F depicts an embodiment of the present disclosure in which the further dielectric material 228 has been applied with a substantially uniform thickness over all exposed surfaces of the first metal material 216 in the second cavity 208. However, in alternative embodiments, depending on the design and application of the interconnect structure, it may be desirable for the further dielectric material 228 to have different thicknesses within the second cavity 208. In other words, the distribution of the further dielectric material 228 within the second cavity 208 can be tuned depending on the desired capacitance density and line resistance of a particular application. More specifically, the thickness of the further dielectric material 228 will impact the properties and performance of the MDM capacitor 244. Likewise, given a certain width and depth of the wide line, the thickness of the further dielectric material 228 affects the amount of conductive metal material in the line, thereby impacting the properties (e.g., line resistance) of the resulting line. Accordingly, the thickness of the further dielectric material 228 can be altered to create a desired effect.

For example, for some applications, it may be desirable to form a power line having a lower line resistance and a lower capacitance density. This outcome can be achieved by embodiments of the present disclosure in which the further dielectric material is selectively removed from the bottom surface of the second cavity. Alternatively, this outcome can be achieved by embodiments of the present disclosure in which the further dielectric material is selectively applied to the sidewall surfaces of the second cavity.

Figure 3:
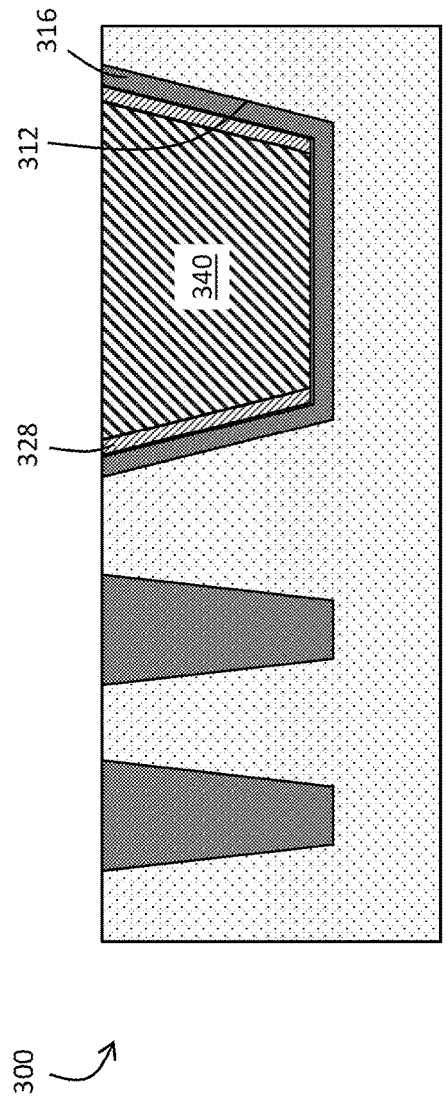
FIG. 3 illustrates an alternative example of a component following the performance of the example method of FIG. 1, in accordance with embodiments of the present disclosure.

FIG. 3 depicts an example structure 300 according to one of these embodiments. The example structure 300 is substantially similar in structure and function to the example structure 200 described above with reference to FIGS. 2A-2F. (Accordingly, for simplicity, similar features are indicated with corresponding reference numerals.) The example structure 300 is different from the example structure 200, however, in that the further dielectric material 328 is not present between the first metal material 316 and the second metal material 340 at the bottom of the second cavity 312. In other words, the first metal material 316 is in direct contact with both the further dielectric material 328 and the second metal material 340.

Like the example structure 200, the example structure 300 can be formed by performing the method 100. However, in the formation of the example structure 300, the performance of operation 108 further includes selectively removing a portion of the further dielectric material from a substantially horizontal exposed surface of the first metal material prior to depositing the second metal material. The portion of the further dielectric material can be removed selectively by, for example, performing spacer deposition and etching.

Conversely, for some applications, it may be desirable to form a power line having a higher line resistance and a higher capacitance density. This outcome can be achieved by embodiments of the present disclosure in which the further dielectric material is made thicker on the bottom surface of the second cavity. Alternatively, this outcome can be achieved by embodiments of the present disclosure in which the further dielectric material is selectively thinned on the sidewall surfaces of the second cavity.

Figure 4:
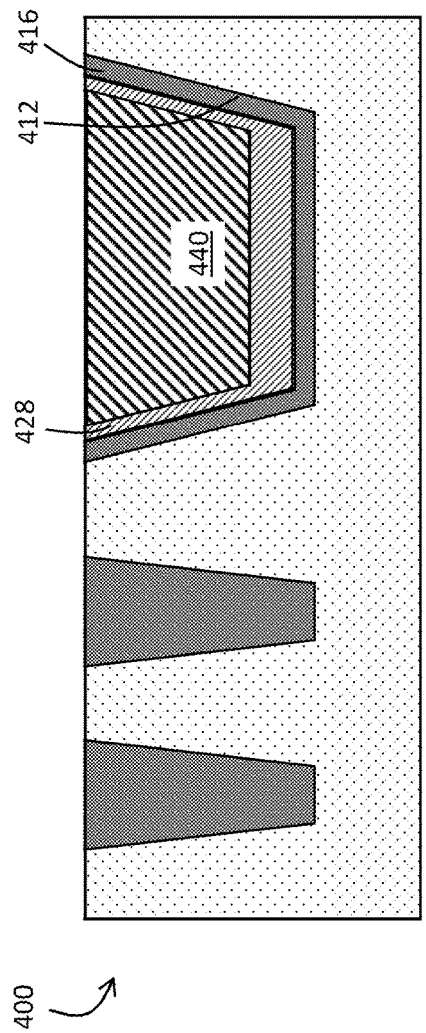
FIG. 4 illustrates an alternative example of a component following the performance of the example method of FIG. 1, in accordance with embodiments of the present disclosure.

FIG. 4 depicts an example structure 400 according to one of these embodiments. The example structure 400 is substantially similar in structure and function to the example structure 200 described above with reference to FIGS. 2A-2F. (Accordingly, for simplicity, similar features are indicated with corresponding reference numerals.) The example structure 400 is different from the example structure 200, however, in that the further dielectric material 428 is made thicker between the first metal material 416 and the second metal material 440 at the bottom of the second cavity 412. In other words, the further dielectric material 428 is thicker on substantially horizontal exposed surfaces of the first metal material 416 than on non-substantially horizontal exposed surfaces of the first metal material.

Like the example structure 200, the example structure 400 can be formed by performing the method 100. However, in the formation of the example structure 400, the performance of operation 108 further includes selectively applying the further dielectric material so as to be thicker on substantially horizontal exposed surfaces of the first metal material prior to depositing the second metal material. The portion of the further dielectric material can be made thicker selectively by, for example, performing PVD deposition with high bias to control directionality.

Notably, any of the example structures 200, 300, and 400 can be utilized in backside power delivery. Traditionally, all interconnect wiring is arranged on the same side of a chip. In particular, all interconnect wiring is arranged on the same side of the chip as the transistor region such that the transistor region is arranged between the interconnect wiring and the wafer substrate. The side of the chip on which the transistor region and interconnect wiring are arranged is referred to as the "front side" of the chip. Conversely, the opposite side of the chip is referred to as the "back side" of the chip. In traditional arrangements, the interconnect wiring arranged on the front side of the chip provides both signal and power to the transistors in the device region of the chip.

Backside power delivery refers to a chip arrangement in which the wafer substrate is thinned and interconnect wiring used for power delivery is put on the back side of the chip. In such arrangements, the wafer substrate includes structures that facilitate transmission of power and signals from interconnect wiring arranged on the back side of the chip to the device region arranged on the front side of the chip. In such arrangements, interconnect wiring can still be arranged on the front side of the chip as well. Accordingly, interconnect wiring can be connected to both the front side and the back side of the chip. Such arrangements can enable interconnect wiring on the front side of the chip to be used exclusively to transmit signals. The interconnect wiring on the back side of the chip can be used exclusively to transmit power or to transmit both power and signals. The example structures 200, 300, and 400 are well suited for backside power delivery and can be utilized for interconnect wiring on the front side and on the back side of a chip.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method of making a semiconductor component, the method comprising:
   depositing a first metal material onto a structure having a first cavity and a second cavity such that the first metal material fills the first cavity and forms a first lining on exposed surfaces of the second cavity;
   depositing a dielectric material onto the structure such that the dielectric material forms a second lining on exposed surfaces of the first lining, such that the second lining has a first thickness on substantially horizontal exposed surfaces of the first lining and a second thickness on non-substantially horizontal exposed surfaces of the first lining, and such that the first thickness is different than the second thickness; and
   depositing a second metal material onto the structure such that the second metal material fills remaining volume in the second cavity.

2. The method of claim 1, wherein the first cavity has a first width and the second cavity has a second width that is greater than the first width.

3. The method of claim 1, wherein depositing the dielectric material includes depositing the dielectric material such that the dielectric material is in direct contact with the first metal material.

4. The method of claim 1, wherein depositing the second metal material includes depositing the second metal material such that the second metal material is in direct contact with the dielectric material.

5. The method of claim 1, wherein depositing the second metal material includes depositing the second metal material using physical vapor deposition.

6. The method of claim 1, wherein depositing the dielectric material includes depositing the dielectric material using physical vapor deposition.

7. The method of claim 1, wherein depositing the dielectric material includes depositing the dielectric material such that the first thickness is thicker second thickness.

8. The method of claim 1, further comprising selectively removing a portion of the second lining from a substantially horizontal exposed surface of the first lining prior to depositing the second metal material.

9. The method of claim 1, further comprising removing the second lining from substantially horizontal exposed surfaces of the first lining prior to depositing the second metal material.

10. The method of claim 1, wherein:
    depositing the dielectric material onto the structure includes forming a layer of the dielectric material above the filled first cavity,
    depositing the second metal material onto the structure includes forming a second layer of the second metal material above the filled first cavity, and
    the method further includes removing the layer and the second layer after depositing the second metal material.

11. A semiconductor component, comprising:
    a dielectric material including a first cavity and a second cavity;
    a first metal material in direct contact with the dielectric material such that the first metal material fills the first cavity and such that the first metal material forms a first lining in the second cavity;

a further dielectric material in direct contact with the first metal material such that the further dielectric material forms a second lining in the second cavity, the second lining having a first thickness on substantially horizontal exposed surfaces of the first lining and a second thickness on non-substantially horizontal exposed surfaces of the first lining, the first thickness being different than the second thickness; and a second metal material in direct contact with the further dielectric material such that the second metal material fills the second cavity.

12. The semiconductor component of claim 11, wherein:
the first cavity has a first width, and
the second cavity has a second width that is larger than the first width.

13. The semiconductor component of claim 11, wherein the first metal material in the first cavity forms a signal line.

14. The semiconductor component of claim 11, wherein the second metal material in the second cavity forms a power line.

15. The semiconductor component of claim 11, wherein the second metal material is copper.

16. The semiconductor component of claim 11, wherein the first metal material is not copper.

17. The semiconductor component of claim 11, wherein the first metal material includes a first layer formed of a first material and a second layer formed of a second material.

18. A semiconductor component, comprising:
a dielectric material having a first cavity and a second cavity, wherein:
the first cavity is filled with a first metal material,
the second cavity is lined with the first metal material, further lined with a further dielectric material, and filled with a second metal material such that the first metal material, further dielectric material, and second metal material form a capacitor in the second cavity, and
the further dielectric material has a first thickness on substantially horizontal exposed surfaces of the first metal material and a second thickness on non-substantially horizontal exposed surfaces of the first metal material, the first thickness different than the second thickness.

19. The semiconductor component of claim 18, wherein the first metal material does not include copper.

20. The semiconductor component of claim 18, wherein the second metal material in the second cavity forms a power line.

* * * * *